United States Patent

Moore

(10) Patent No.: US 6,544,047 B2
(45) Date of Patent: Apr. 8, 2003

(54) DUAL-SWIPING INTERCONNECTION CLIP, AND HOOK AND SLOT ARRANGEMENT FOR PRINTED CIRCUIT BOARD (PCB) ATTACHMENT

(75) Inventor: Matthew M. Moore, Columbia, SC (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/821,114

(22) Filed: Mar. 30, 2001

(65) Prior Publication Data

US 2002/0142632 A1 Oct. 3, 2002

(51) Int. Cl.[7] .................................................. A01R 4/66
(52) U.S. Cl. ........................... 439/95; 439/66; 361/753; 174/35 CG
(58) Field of Search ............................. 439/92, 95, 55, 439/64, 862; 361/776, 753, 756; 174/35 CG (56) References Cited

U.S. PATENT DOCUMENTS

| | | | | |
|---|---|---|---|---|
| 4,505,527 A | * | 3/1985 | Reimer | 439/61 |
| 4,664,458 A | * | 5/1987 | Worth | 439/64 |
| 5,001,297 A | * | 3/1991 | Peregrim et al. | 174/35 |
| 5,218,760 A | * | 6/1993 | Colton et al. | 439/92 |
| 5,259,769 A | * | 11/1993 | Cruise et al. | 439/65 |
| 5,691,504 A | | 11/1997 | Sands et al. | 174/35 R |
| 6,217,342 B1 | * | 4/2001 | Neidich et al. | 439/66 |

* cited by examiner

*Primary Examiner*—P. Austin Bradley
*Assistant Examiner*—Briggitte Hammond
(74) *Attorney, Agent, or Firm*—Antonelli, Terry, Stout & Kraus, LLP (57) ABSTRACT

The present invention is directed, in general, to dual-swiping interconnection clip, and hook and slot arrangement for printed circuit board (PCB) attachment.

31 Claims, 4 Drawing Sheets

DUAL-SWIPING INTERCONNECTION CLIP, AND HOOK AND SLOT ARRANGEMENT FOR PRINTED CIRCUIT BOARD (PCB) ATTACHMENT

FIELD

The present invention is directed, in general, to dual-swiping interconnection clip, and hook and slot arrangement for printed circuit board (PCB) attachment.

BACKGROUND

U.S. Pat. No. 5,691,504 ("the '504 patent"), issued Nov. 25, 1997, to Sands et alii and assigned to Dell USA, L.P., provides an excellent background with respect to the present invention, and relevant background discussions have been liberally used from such patent.

While the present invention will be described with respect to a chassis and PCB in a computing apparatus environment (e.g., a personal computer (PC) or server), practice of the present invention is not limited thereto.

A chassis for a computing apparatus has many functions. As one function, it serves as a mounting structure to which the components are secured in prescribed relative positions to one another to allow convenient interconnecting of the components. One such component is a PCB. Background methods of securing a PCB (e.g., a motherboard) to a chassis of the computing apparatus are not only labor intensive, but have disadvantages arrangements.

More particularly, with regard to manufacturing, a plurality of hooks may be stamped in a floor of the chassis and bent upward in a subsequent bending step. The hooks are arranged to provide structure for mating with slots in the PCB and allowing sliding between the PCB slot and mated hook, with the hook ultimately capturing opposing sides of the PCB. The hooks may be, by themselves, inadequate to provide sufficient grounding of the PCB to the chassis, since the contact area between the hooks and the PCB is relatively small and since variations in PCB thickness negate any guarantee of a tight conduction fit with the hooks to form a good grounding path.

Accordingly, some background chassis further provide a plurality of bosses that rise from the chassis floor at predetermined locations and provide a grounding path between the PCB and the chassis. Such bosses are adapted to receive screws or bolts that pass through holes in the PCB. Once the PCB is slid into a desired position within the channel created by the hooks, significant labor is required to align the apertures of the PCB with respect to the bosses and to drive the individual screws or bolts through each of the holes into their corresponding bosses. Further disadvantageously, the bosses are often thread-stripped during manufacture or repair when the screws or bolts are over-torqued or axially misaligned. Still further, the screws may dangerously fall into the equipment, thus representing a short-circuiting agent.

Other background chassis (e.g., the '504 patent) use spring members that rise from the chassis floor at predetermined locations and provide a grounding path between the PCB and the chassis. Such spring members are stamped in, and monolithic with, a floor of the chassis and then bent upward in a subsequent bending step.

As a disadvantage, the locations of the bosses and stamped hooks/spring-members are often chosen primarily to afford the most reliable mechanical support for the PCB, as well as to insure continued rigidity of the chassis, i.e., they are rarely optimized for electrical grounding. Such places a burden on the designer to take care in the design of the PCB to route grounding traces to the correct locations on the PCB. Such often results in awkward and inefficient PCB layout.

In another chassis function, the chassis serves as a barrier for electromagnetic interference ("EMI") caused by electromagnetic fields generated inside or outside the chassis. As computers have grown more powerful, the electronic components thereof have become faster, increasing the potential for generation of interfering (and thus often illegal) radio frequency interference ("RFI"). Further, the electronic components have themselves become more sensitive to RFI generated externally. Therefore, good chassis design dictates that open holes in the chassis be minimized to block EMI. Further, the chassis should provide a grounding path for energy contained in the EMI. Since the hooks and background spring members are formed by stamping and bending a portion of the floor of the chassis, each resulting hook and background spring member has associated therewith a punched aperture in the chassis created by the displacement of material to create the hook or spring member. Such is disadvantageous in allowing EMI to leak into and out of the chassis.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and that the invention is not limited thereto. The spirit and scope of the present invention are limited only by the terms of the appended claims.

The following represents brief descriptions of the drawings, wherein.

DETAILED DESCRIPTION

Before beginning a detailed description of the subject invention, mention of the following is in order. When appropriate, like reference numerals and characters may be used to designate identical, corresponding or similar components in differing FIG. drawings. Further, in the detailed description to follow, example sizes, shapes, materials may be given, although the present invention is not limited to the same. Further, arrangements may be shown in simplistic form in order to avoid obscuring the invention.

What is needed in the art are an interconnection clip that provides good mechanical mounting, reliable electrical grounding and EMI suppression, as well as a PCB mounting arrangement and method of mounting thereof that eliminate much of the labor previously required to mount PCBs during computing apparatus manufacture and servicing.

With these functions in mind, as background, the manufacturing process for electronics chassis for typical computing apparatus (e.g., PCs or servers) is at least a three-step process depending, in large part, on the final desired shape of the chassis, the manner in which the chassis is to be secured to its environment, and the manner in which electronic components are to be secured within the chassis. Manufacture of a typical chassis (generally a box-like structure) begins by stamping parts of the chassis out of sheet metal with a die press. The stamping step yields one or more flat sheets of metal having a desired geometry. The flat sheets are then bent or folded to form portions of the finished chassis. In the bending step, various edges of the flat sheet are brought into proximity with one another to form edges and corners of the chassis portions. The edges or corners may be spot welded, soldered or brazed together to create a permanent bond. Finally, screws or other removable fasteners may be used removably to join the chassis portions together to form a rigid, mechanically sturdy chassis, to form a barrier as against EMI emanating from the components in the chassis, to shield the components from stray EMI from outside the chassis, and to form good electrical conductivity in the chassis for grounding purposes (all described previously).

Figure 1:
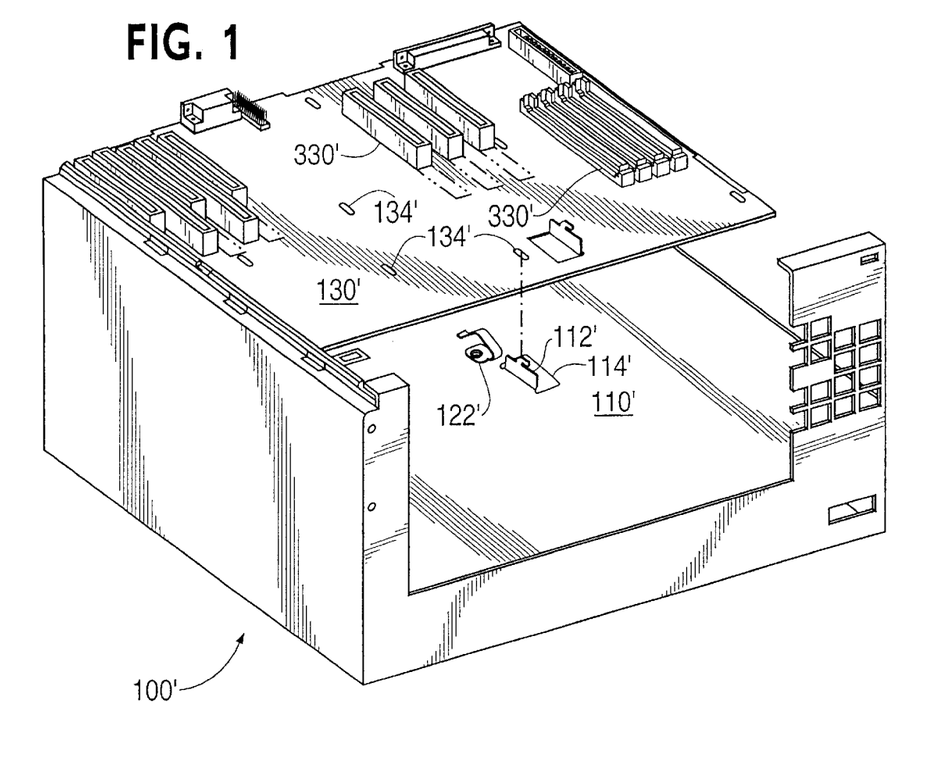
FIG. 1 illustrates an exploded isometric view of an example chassis of the present invention and an example PCB, wherein example embodiment PCB mount hook and spring members are illustrated with respect to the chassis and PCB.

Referring initially to FIG. 1, illustrated is an exploded isometric view of an example chassis of the present invention, wherein an example embodiment PCB mount hook and spring member are illustrated with respect to the chassis and example PCB. The chassis, generally designated 100', includes at least one chassis portion 110' typically composed of a conductive material such as cold-rolled steel.

In the illustrated embodiment, the PCB 130' is a motherboard of a PC or server. As such, the PCB 130' may contain electrical connectors 330' allowing the PCB 130' to be electrically coupled to, and mechanically support, daughterboards (not shown) that may contain computer memory or other peripheral circuitry. Firm mechanical support of the daughterboards is a further reason for the need for dependable mechanical mounting that the present invention affords.

Turning to further detailed discussion, the chassis portion 110' has a plurality of associated pairs of integral PCB mounts 112' (only one shown for simplicity and clarity of illustration) and chassis apertures 114' formed in a substantially planar wall thereof, illustrated as being the floor of the chassis 110'. The PCB mounts protrude toward an interior of the chassis 100'.

The chassis portion 110' further has a plurality of integral spring members 122' (only one shown for simplicity and clarity of illustration) secured to a substantially planar wall thereof, again illustrated as being the floor of the chassis portion. The plurality of PCB mounts 112' and the plurality of spring members 122' cooperate to mount a PCB 130' to the chassis 100' and to provide a grounding path from the PCB 130' to the chassis 100' for electrical currents associated with the PCB 130'.

Each of the plurality of PCB mounts 112' comprises a hook portion 113'. An inner surface 115' of the hook portion 113' bears against a first surface 132' of the PCB 130' to retain the PCB 130' in proximity with the chassis portion. More particularly, the hook portion 113' reaches through apertures 134' in the PCB 130' to bear against the PCB's first surface 132'.

Figure 5A:
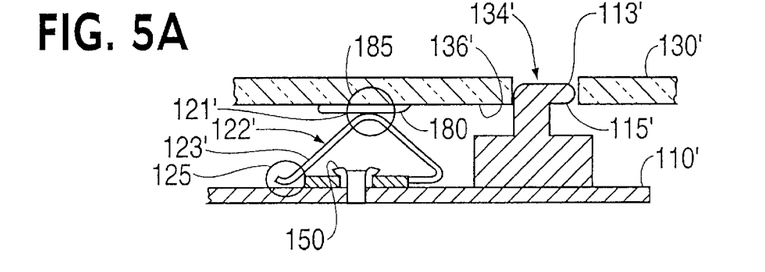
FIGS. 5A–5B illustrate cross-sectional views of the further stages of the mounting of the PCB to the PCB mount hook and spring member.

Each of the plurality of spring members 122' are made, for example, into a form of an elongated bent-leg shape and include, for example, a knee portion 121' and a cantilevered foot projection 123'. In the illustrated example embodiment, the plurality of spring members 122' are composed, for example, of a conductive material and are bearable against conductors 180 (as shown in FIG. 5A) deposited on a second surface (a lower surface) of the PCB 130' as well as against an internal conductive surface of the chassis portion 110 ' to provide the grounding path therebetween. Further in the example embodiment, the spring members 122' are made of a resilient material so as to bear against both the conductors 180 and internal conductive surface of the chassis portion 110' simultaneously to urge the PCB 130' into contact with the plurality of PCB mounts 112'. In the illustrated example embodiment, the spring members 122' are composed, for example, of a spring stainless steel or beryllium copper, giving the spring members 122' great resilience. In another example, the spring member or clip can be made of, for example, 0.013Δ thick tin-plated phosphor bronze material.

Figure 2A:
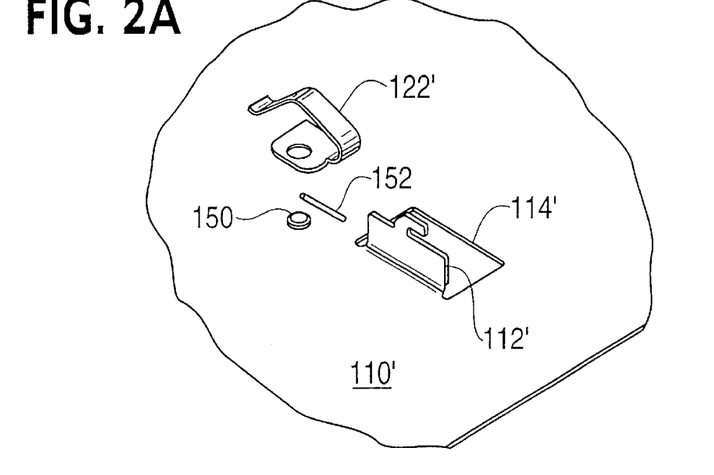
FIGS. 2A–2C illustrate partial views illustrating a clearer view of the PCB mount hook, as well as a clearer view of the spring member and an arrangement/mounting of the spring member with respect to the chassis.
Figure 2B:
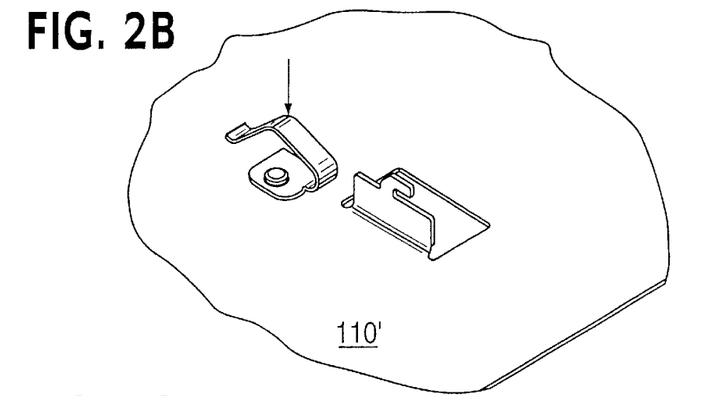
Figure 2C:
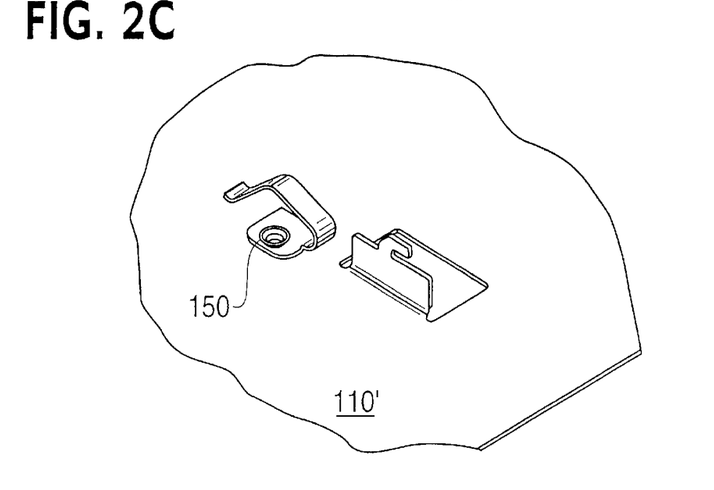

FIGS. 2A–2C show further constructions of, and mounting of, the spring member 122'. More specifically, in FIG. 2A, in addition to the spring member 122', there is also shown a pierce-and-extrude cylinder rising from and monolithic with the chassis 110'. The spring member 122' has a mounting hole which is placed onto the pierce-and-extrude cylinder as shown in FIG. 2B, and then a known spreading tool is used to swage or mushroom the pierce-and-extrude cylinder outward so as to lock the spring member 122' integral to the chassis 110'. Such mushrooming 150' can be most clearly seen in FIG. 5A or 5B. (It would be appreciated by those skilled in the art that the hook portion may likewise be swaged, as shown in phantom line form in FIG. 5B.) If not apparent from the illustrations, it should be understood that the bent leg portion of the spring member 122' does not lie over (i.e., block access to) the pierce-and-extrude cylinder, such that the spreading tool can be applied to the pierce-and-extrude cylinder without obstruction.

Figure 6:
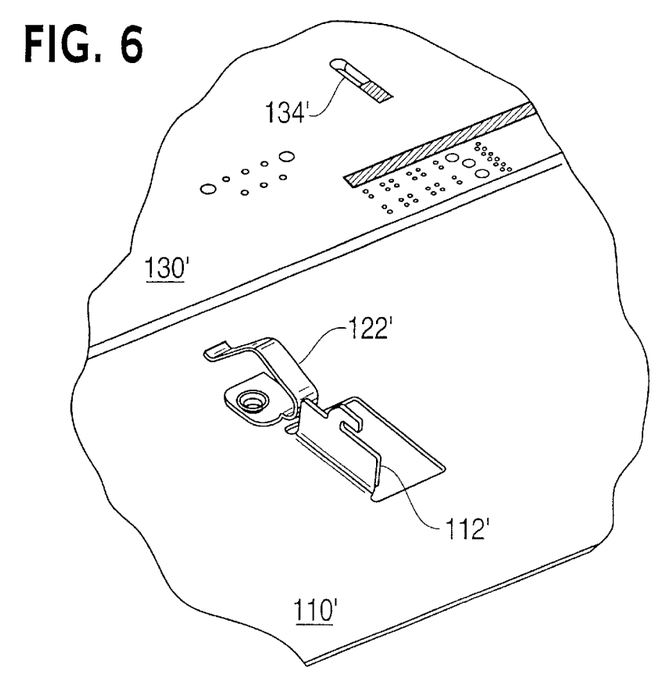
FIG. 6 illustrates an alternative arrangement of an example slotted spring member interlocked with the PCB mount hook.

In addition to the pierce-and-extrude arrangement, it may be desired to provide an additional arrangement to prevent subsequent rotation of the spring member 122', which rotation may disadvantageously cause contact to, and short-circuiting of, live portions of the PCB. FIG. 2A illustrates one example method to prevent such rotation. More specifically, shown is an additional slot 152 within the chassis 110'. The spring member 122' then has a bent portion (not shown) which mates with the slot 152 so as to prevent rotation. It should be apparent to those skilled in the art that other arrangement for preventing rotation also are viable. For example, the spring member 122' can have a slot 122S cut therein, as shown in phantom lines in FIG. 3, and such slotted spring member 122' could instead be mounted closer to, and interlocked with, the PCB mount 112', as shown in FIG. 6. In addition, a base of the spring member 122' could just as easily interlock with two pierce-and-extrude arrangements, or a single pierce-and-extrude arrangement can be of a shape not allowing rotation, e.g., an oval, rectangle, etc. In addition to the pierce-and-extrude arrangement, it also should be apparent that other types of attachment arrangements also are viable, e.g., spot welding, rivets, screws, etc. Finally, in some implementations, the clip may not have to be rigidly or integrally secured to the chassis, i.e., a lesser degree of containment may be sufficient as long as the clip is allowed to effect its biasing and dual-swiping action.

Figure 3:
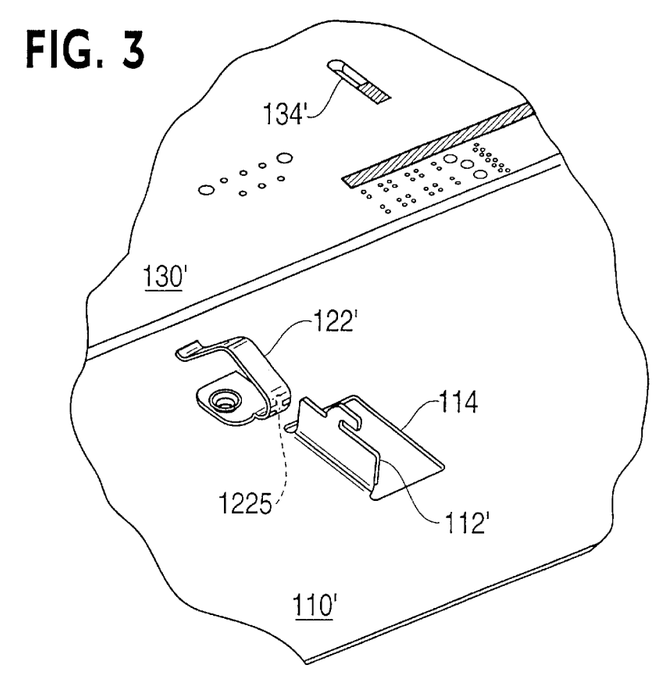
FIG. 3 illustrates an initial stage of a mounting of the PCB to the PCB mount hook and spring member.
Figure 4A:
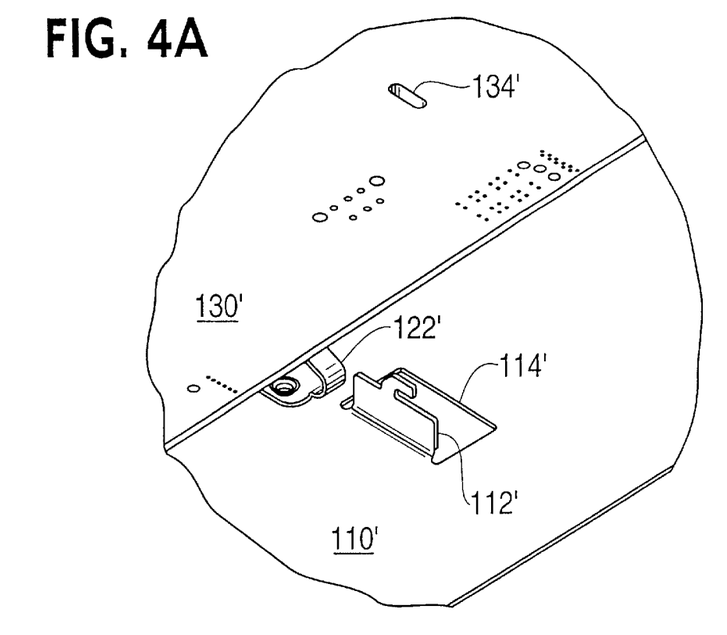
FIGS. 4A–4C illustrate further stages of a mounting of the PCB to the PCB mount hook and spring member.
Figure 4B:
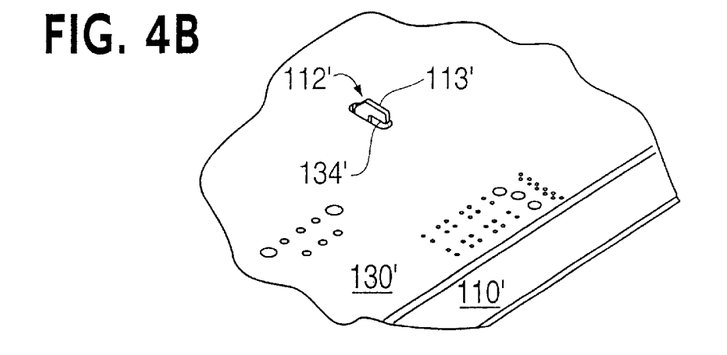
Figure 4C:
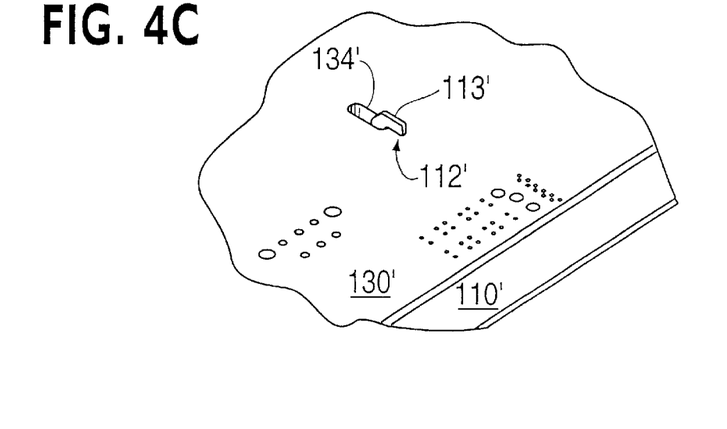

FIG. 3 shows the assembled spring member arrangement as well as the PCB mount 112' arrangement, with the PCB 130' and aperture 134' approaching such arrangements for mounting of the PCB 130' to the chassis 110'. FIGS. 4A–4C, 5A and 5B are further illustrative of such mounting arrangements. More particularly, in FIG. 4A, the PCB 130' continues to approach the mounting arrangements, and in FIG. 5A, the hook portion 113' is shown as having entered the aperture 134' of the PCB 130'. In FIG. 4B, the hook portion 113' is shown as extending fully through the aperture 134', and finally, in FIGS. 4C and 5B, the PCB 130' is shown as having been slid horizontally such that a portion thereof is slid under and interlocked (i.e., held) by the portion 113' in an installed positions. The spring members 122' continue to urge against the chassis surface and pad 180 to provide a path for electrical currents from the PCB 130' to the chassis 100'. The spring members 122' further urge the PCB 130' against the inner surface 115' of the PCB mounts 112' to help hold the PCB 130' in place mechanically.

As a result of the foregoing arrangements and operations, a minimum time is required to install or service a PC or server board, thus significantly reducing and improving manufacturing and servicing throughput.

Figure 5B:
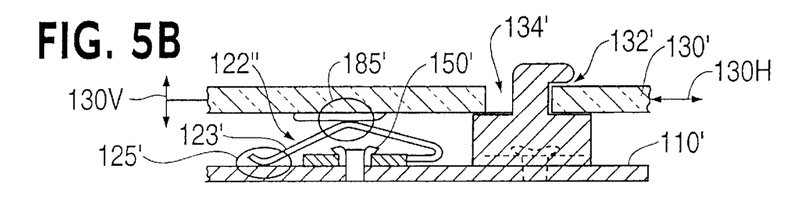

Turning now specifically to FIGS. 5A and 5B, an important dual-swiping action of the example embodiment of the present invention will be explained. More specifically, viewing FIG. 5A, there can be seen the PCB 130' being fitted onto the hook portion 113'. The spring member 122' is at first generally in a relaxed or fully bent position, i.e., again, looking somewhat like a bent leg having the knee portion 121' and a cantilevered foot projection 123'. At some point of PCB 130' fitting, the knee portion 121' will contact the printed PCB's conductive grounding pad 180 at a first point of contact as shown within the FIG. 5A area 185. Likewise, the cantilevered foot projection 123' will contact the inner conductive surface of the chassis floor 110' at a first point of contact, as shown within the area 125. As the PCB 130' is further depressed onto the hook portion 113' and then is slid horizontally to be held by the hook portion 113', the spring member 122' becomes distorted from its initial bent-leg shape into a more straightened-leg shape 122".

During such loading, spring member distortion and PCB shifting, an advantageous dual-swiping action is afforded. More particularly, while the knee portion 121' contacts the conductive grounding pad 180 at a first location as shown in the FIG. 5A area 185, the subsequent continued loading of the PCB 130' downward and resultant distortion of the knee portion 121' causes the knee portion to drag or swipe across the conductive grounding pad 180. Additionally, the subsequent shifting of the PCB 130' causes further swiping therebetween. Eventually, the knee portion 121' will end up at in contact with the conductive grounding pad 180 at a second location as shown in the FIG. 5B area 185'. Such is advantageous in that any dirt or oxide layer which has formed on either of the spring member's knee portion 121' or the PCB's conductive grounding pad 180 will be swiped clean so as to improve a conductive grounding contact between the knee portion 121' and conductive grounding pad 180. Although not required, the knee portion 121' may be provided to have a somewhat abrasive character so as to assist in and enhance cleaning.

A likewise swiping action occurs between the cantilevered foot projection 123' and the inner conductive surface of the chassis 110'. More specifically, at some point of initial loading, the cantilevered foot projection 123' contacts the inner conductive surface 110' and then, with subsequent further loading and spring member distortion, the cantilevered foot projection 123' is pushed across the inner conductive surface of the chassis 110'. Eventually, the cantilevered foot projection 123' will end up at in contact with the chassis 110' at a second location as shown in the FIG. 5B area 125'. Again, any dirt or oxide layer which has formed is swiped clean, again improving a conductive grounding contact between the distorted spring member 122" and the inner conductive surface of the chassis 110'. So as to provide the best possible electrical contact between the cantilevered foot projection 123' and the inner conductive surface of the chassis 110', the inner conductive surface should remain unpainted and free of any insulation-type coatings or materials. Again, although not required, a contacting area of the cantilevered foot projection 123' may be provided to have a somewhat abrasive character so as to assist in and enhance cleaning.

In addition to the dual-swiping action being advantageous to provide clean contacts during PCB loading and mounting, such dual-swiping action continues to provide advantages during subsequent flexing or vibration of the PCB 130'. More specifically, in FIG. 5B, there are illustrated a horizontal flexing or vibration, representatively shown by dual-direction arrow 130H as well as a vertical flexing or vibration, representatively shown by dual-directional arrow 130V. Any subsequent flexing or vibration of the PCB 130' with respect to the chassis 110' causes the knee portion 121' or cantilevered foot projection 123' to rub or drag against the conductive grounding pad 180 and inner conductive surface 110', either in a single direction, or back-and-forth directions, thus continuing to clean and provide good conductive contacts. As a distinct advantage of the present invention, because of the continued dual-swiping action of the clip, the risk of loss of conductive ground contact due to corrosion over time is reduced.

As previously described, it is advantageous that the chassis 100' allow flexibility in PCB layout. Accordingly, embodiments of the invention allows traces to be advantageously routed on the PCB 130', and the spring members 122' placed as a function of the routing, thereby freeing board layout designers somewhat from having to concern themselves with a fixed way in which the PCB 130' is to be grounded to the chassis 100'. That is, the present invention allows PCB 130' layout to determine the locations of the mechanical mounts and electrical grounds, not vice versa. Such PCB mounts 112' and spring members 122' need not be arranged in a precise two-dimensional orthogonal array. In fact, the PCB mounts 112' may be located at any point on the wall of the chassis portion 110' and there may be as few or many mounts 112' as desired, as long as stable PCB mounting is afforded. Further, the spring members 122' may be located at any point, and there may be as few or many members 122' as desired. Finally, there does not need to be a one-to-one-correspondence between PCB mounts 112' or spring members 122'. That is, although not shown, certain of the PCB mounts 112' may lack corresponding spring members 122' and certain of the spring members 122' may lack corresponding PCB mounts 112'.

The chassis 100' may further comprise an access panel (not shown) removably mountable to the chassis portion 110' to retain the PCB 130' in engagement with the plurality of PCB mounts 112'. To assemble the chassis 100', the PCB 130' slots 134' are registered with the PCB mounts 112', the PCB 130' lowered into place and shifted horizontally and rearwardly, as shown, thereby causing the PCB 130' to be held between the inner surface 115' and the spring member 122'. To ensure that the PCB 130' does not shift into disengagement, the access panel is fastened into place, for example, with a couple of screws or bolts in a conventional manner. Coupling the access panel to the chassis portion 110' may be used to block return shifting and thereby lock the PCB 130' into its laterally shifted position, preventing the PCB 130' from shifting back inadvertently and perhaps disengaging from the PCB mounts 112'. Therefore, it is apparent that the present invention allows the PCB 130' to be mounted in place with only a couple of fasteners, rather than with a fastener for each of a number of bosses.

In distinguishing the aforementioned '504 patent, such patent actually teaches away from the present invention. More particularly, as mentioned previously, the '504 patent has spring members 122 ('504 FIG. 3) which are stamped out of, and monolithic with, a chassis portion. Column 3, lines 35–40 of the '504 patent indicates that "individual springs would be tedious and time consuming to assemble or repair." Further, column 5, lines 52–55 of the '504 patent states that "since the spring members 122 are formed integrally with the chassis portion 20, the complication and expense of individual springs are avoided." As an additional difference, the arrangement of the '504 patent utilizes an additional major chassis component, i.e., an inner chassis portion 120, which adds to further expense and weight of the chassis in the '504 patent. More specifically, the '504 patent appears to be directed mainly toward preventing electromagnetic interference ("EMI") from escaping from, or intruding into, the chassis. Accordingly, the '504 inner chassis portion 120 (see FIG. 3 of the '504 patent) further has associated sidewalls 128 such that the inner chassis portion 120 both occludes chassis apertures and envelops transverse electromagnetic ("TEM") waves attempting to emanate from the PCB in a plane direction thereof. The '504 patent is further disadvantageous in that, by providing the spring members 122 as being a monolithic part of the chassis member, the chassis member must be made of a specialized material (e.g., spring stainless steel or beryllium copper) to give the spring members great resilience, whereas the specialized material would further add to the expense to the chassis of the '504 patent. Further, it is submitted that the multilayered chassis arrangement of the '504 patent would further increase a parts inventory required to be maintained by the manufacturer as well as add to the complexity and time in assembly by requiring multiple layers of chassis to be aligned to one another.

In synopsis of the present invention, the dual-swiping grounding clip design presented herein provides excellent grounding of a PC or server board to a sheet metal chassis, while minimizing hardware handled by an end user, and simplifying serviceability. Further, such clips and the clip/hook arrangements should allow flexibility in the layout of the PCBs, i.e., a novel mounting structure featuring cooperating mounts and spring members to hold the PCB in place, providing both mechanical and electrical support for the board. Still further, embodiments of the present invention provide a chassis that allows rapid and reliable mechanical mounting and electrical grounding of a PCB and chassis, and a chassis that is easy and inexpensive to manufacture. The spring arrangements not being associated with windows punched through the chassis provides a tighter EMI shield to attenuate electromagnetic radiation emanating from the PCB. In one example embodiment of the present invention, the chassis further comprises an access panel removably couplable to the chassis portion to retain the PCB in engagement with the plurality of PCB mounts. In a manner described, the PCB is lowered onto the PCB mounts and shifted laterally into engagement with the mounts to fix the PCB in place. Coupling the access panel to the chassis portion may be used to lock the PCB into its laterally shifted position, preventing the PCB from shifting back inadvertently and perhaps disengaging from the PCB mounts.

In concluding, reference in the specification to "one embodiment", "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

This concludes the description of the example embodiments. Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

As example alternatives, the clip of the present invention is not necessarily just for grounding, i.e., the clip may be used to provide a reliable path for power, data lines, or signals. Further, use of the clip is not necessarily limited to use a chassis and PCB, i.e., the clip may have uses in other environments such as providing conduction or grounding between a chassis and a non-PCB component (e.g., a motor), or even between a non-PCB component and a non-chassis component (e.g., a motor and a power source). In another example environment, the conductive clip can be applied to provide a reliable conductive path between two PCBs. In addition, while the above-described clip is described as being generally of a bent-leg shape, other shapes may likewise be arranged to provide the dual-swiping action. Still further, the clip does not have to be made wholly of metal, i.e., can be a plastic biasing clip with some arrangement (e.g., a wire) for providing a conductive path. Finally, despite having illustrated the present invention in the environment of a computer chassis 100' with a PCB 130' therein, those of ordinary skill in the art will recognize, however, that the present invention finds advantageous use in any electronic apparatus requiring the mounting of a PCB 130' within a chassis 100', such as in audio or communications equipment.

What is claimed is:

1. A conductive clip/hook interconnection comprising:
a monolithic clip including a substantially flat base mechanically securable against a first component, a first contact area of substantially an apex which is substantially opposite to a flat portion of the base to contact a conductive area of a second component, and a second contact area to contact a different conductive area of the first component adjacent to the base, so as to connect the electrical conductive path between the first component and second component, the clip to exert mechanical biasing against the first component and second component at the conductive area and the different conductive area, respectively, and arranged to swipe the first contact area and the second contact area across the conductive area and the different conductive area, respectively, responsive to relative displacements of the first component with respect to the second component, to clean conduction contact therebetween; and, a hook providable on one of the first component and the second component, the hook cooperative with an opposite one of the first component and second component to secure the first component and the second component to one another.

2. A conductive clip/hook interconnection as claimed in claim 1, wherein the clip is made substantially of an electrical conductive material.

3. A conductive clip/hook interconnection as claimed in claim 1, wherein the clip is made substantially of a biasing material.

4. A conductive clip/hook interconnection as claimed in claim 1, wherein the clip generally has a bent-leg shape.

5. A conductive clip/hook interconnection as claimed in claim 1, wherein the clip normally has a general triangular shape, and a more flattened general triangular shape upon increased biased mounting thereof between the first component and the second component.

6. A conductive clip/hook interconnection as claimed in claim 1, wherein at least one of the clip and the hook are securable by a swage operation.

7. A conductive clip/hook interconnection as claimed in claim 1, wherein the clip is a grounding clip to provide an electrical ground conductive path between the first component and the second component.

8. A conductive clip/hook interconnection as claimed in claim 7, wherein the first component is a metallic chassis of one of a personal computer (PC), server, audio equipment, and a consumer electronic product, and the second component is a printed circuit board (PCB).

9. A conductive clip/hook interconnection as claimed in claim 7, wherein the first component is one of a printed circuit board (PCB) and a metallic chassis, and the second component is one of a PCB and a metallic chassis.

10. A conductive clip/hook interconnection as claimed in claim 9, wherein the conductive area is a conductive grounding pad on the PCB, and the different conductive area is a metallic surface with respect to the second component.

11. A mounting arrangement as claimed in claim 12, wherein at least one of the clip and the hook are secured by a swage operation.

12. A printed circuit board (PCB) mounting arrangement comprising:

a monolithic clip to provide an electrical conductive path, the clip including a substantially flat base mechanically secured against a chassis component, a first contact area of substantially an apex which is substantially opposite to a flat portion of the base to contact a conductive area of a PCB, and a second contact area to contact a different conductive area of the chassis component adjacent to the base, so as to connect the electrical conductive path between the PCB and chassis component, the clip to exert mechanical biasing against the PCB and chassis component at the conductive area and the different conductive area, respectively, and arranged to swipe the first contact area and the second contact area across the conductive area and the different conductive area, respectively, responsive to relative displacements of the PCB with respect to the chassis component, to clean conduction contact therebetween; and a hook provided on one of the chassis component and the PCB, the hook cooperative with an opposite one of the chassis component and the PCB as a relative position securing member to secure the PCB in a substantially fixed position relative to the chassis component.

13. A mounting arrangement as claimed in claim 12, wherein the clip is a grounding clip to provide an electrical ground conductive path between the PCB and the chassis component.

14. A mounting arrangement as claimed in claim 12, wherein the chassis component is the metallic chassis of one of a personal computer (PC), server, audio equipment, and a consumer electronic product.

15. A mounting arrangement as claimed in claim 12, wherein the hook cooperates with a mateable/slidable slot.

16. A mounting arrangement as claimed in claim 12, wherein the conductive area is a conductive grounding pad on the PCB, and the different conductive area is a metallic surface with respect to the chassis component.

17. A mounting arrangement as claimed in claim 12, wherein the clip is made substantially of an electrical conductive material.

18. A mounting arrangement as claimed in claim 12, wherein the clip is made substantially of a biasing material.

19. A mounting arrangement as claimed in claim 12, wherein the clip generally has a bent-leg shape.

20. A mounting arrangement as claimed in claim 12, wherein the clip normally has a general triangular shape, and a more flattened general triangular shape upon increased biased mounting thereof between the chassis component and the PCB.

21. An electronic apparatus having a printed circuit board (PCB) mounting arrangement, the apparatus comprising:

a monolithic clip to provide an electrical conductive path, the clip including a substantially flat base mechanically secured against a chassis component, a first contact area of substantially an apex which is substantially opposite to a flat portion of the base to contact a conductive area of a PCB, and a second contact area to contact a different conductive area of the chassis component adjacent to the base, so as to connect the electrical conductive path between the PCB and chassis component, the clip to exert mechanical biasing against the PCB and chassis component at the conductive area and the different conductive area, respectively, and arranged to swipe the first contact area and the second contact area across the conductive area and the different conductive area, respectively, responsive to relative displacements of the PCB with respect to the chassis component, to clean conduction contact therebetween; and a hook provided on one of the chassis component and the PCB, the hook cooperative with an opposite one of the chassis component and the PCB as a relative position securing member to secure the PCB in a substantially fixed position relative to the chassis component.

22. An apparatus as claimed in claim 21, wherein the clip is a grounding clip to provide an electrical ground conductive path between the PCB and the chassis component.

23. An apparatus as claimed in claim 21, wherein the electronic apparatus is one of a personal computer (PC), server, audio equipment, and a consumer electronic product.

24. An apparatus as claimed in claim 21, wherein the hook cooperates with a mateable/slidable slot.

25. An apparatus as claimed in claim 21, wherein the conductive area is a conductive grounding pad on the PCB, and the different conductive area is a metallic surface with respect to the chassis component.

26. An apparatus as claimed in claim 21, wherein the clip is made substantially of an electrical conductive material.

27. An apparatus as claimed in claim 21, wherein the clip is made substantially of a biasing material.

28. An apparatus as claimed in claim 21, wherein the clip generally has a bent-leg shape.

29. An apparatus as claimed in claim 21, wherein the clip normally has a general triangular shape, and a more flattened general triangular shape upon increased biased mounting thereof between the chassis component and the PCB.

30. A mounting arrangement as claimed in claim 21, wherein at least one of the clip and the hook are secured by a swage operation.

31. A printed circuit board (PCB) mounting method comprising:

providing a monolithic clip for an electrical conductive path, the clip mechanically secured at a substantially flat base thereof against a chassis component, a first contact area of substantially an apex which is substantially opposite to a flat portion of the base to contact a conductive area of a PCB, and a second contact area to contact a different conductive area of the chassis component adjacent to the base, so as to connect the electrical conductive path between the PCB and chassis component, the clip to exert mechanical biasing against the PCB and chassis component at the conductive area and the different conductive area, respectively, and arranged to swipe the first contact area and the second contact area across the conductive area and the different conductive area, respectively, responsive to relative displacements of the PCB with respect to the chassis component, to clean conduction contact therebetween;

providing a hook on one of the chassis component and the PCB, the hook cooperative with an opposite one of the chassis component and the PCB as a relative position securing member to secure the PCB in a substantially fixed position relative to the chassis component; and installing the PCB while making contact between the clip and the PCB, and securing the PCB relative to the chassis component using the relative position securing member.

* * * * *